(12) United States Patent
Park et al.

(10) Patent No.: US 11,626,287 B2
(45) Date of Patent: Apr. 11, 2023

(54) SEMICONDUCTOR DEVICE WITH IMPROVED CONTACT RESISTANCE AND VIA CONNECTIVITY

(71) Applicant: International Business Machines Corporation, Armonk, NY (US)

(72) Inventors: Chanro Park, Clifton Park, NY (US); Kangguo Cheng, Schenectady, NY (US); Ruilong Xie, Niskayuna, NY (US); Juntao Li, Cohoes, NY (US)

(73) Assignee: International Business Machines Corporation, Armonk, NY (US)

( * ) Notice: Subject to any disclaimer, the term of this patent is extended or adjusted under 35 U.S.C. 154(b) by 133 days.

(21) Appl. No.: 17/133,178

(22) Filed: Dec. 23, 2020

(65) Prior Publication Data
US 2021/0151323 A1 May 20, 2021

Related U.S. Application Data

(62) Division of application No. 16/417,906, filed on May 21, 2019, now Pat. No. 10,930,510.

(51) Int. Cl.
*H01L 21/02* (2006.01)
*H01L 21/285* (2006.01)
(Continued)

(52) U.S. Cl.
CPC ........ *H01L 21/28518* (2013.01); *H01L 29/45* (2013.01); *H01L 29/66795* (2013.01); *H01L 29/7851* (2013.01)

(58) Field of Classification Search
CPC ............... H01L 21/28518; H01L 29/45; H01L 29/7851; H01L 29/66795
See application file for complete search history.

(56) References Cited

U.S. PATENT DOCUMENTS 6,413,822 B2 7/2002 Williams et al.
6,653,009 B2 11/2003 Wang et al.
(Continued)

FOREIGN PATENT DOCUMENTS

KR 1020060073749 A 6/2006

OTHER PUBLICATIONS

List of IBM Patents or Patent Applications Treated as Related.

*Primary Examiner* — Ismail A Muse
(74) *Attorney, Agent, or Firm* — Samuel Waldbaum; Ryan, Mason & Lewis, LLP

(57) ABSTRACT

A method is provided which includes forming a semiconductor substrate having one or more fins. The method includes forming over the fins a plurality of gate structures. The method includes forming gate spacers on sidewalls of the gate structure. The method includes forming a source/drain region on the semiconductor substrate between each adjacent gate spacer. The method includes depositing an interlevel dielectric layer on the source/drain regions and over the gate structures. The method includes depositing a hardmask on the interlevel dielectric layer. The method includes patterning the hardmask to form a plurality of openings and exposing the top surface of each of the source/drain regions. The method includes depositing an optical planarization layer in a portion of the openings and above the top surface of the gate structures. The method includes etching the interlevel dielectric layer in the opening to form an undercut region below the hardmask.

20 Claims, 11 Drawing Sheets

(51) Int. Cl.
    *H01L 29/66*     (2006.01)
    *H01L 29/78*     (2006.01)
    *H01L 29/45*     (2006.01)

(56) References Cited

U.S. PATENT DOCUMENTS

| | | |
|---|---|---|
| 7,517,749 B2 | 4/2009 | Chen et al. |
| 7,884,396 B2 | 2/2011 | Costrini et al. |
| 8,237,228 B2 | 8/2012 | Or-Bach et al. |
| 8,273,610 B2 | 9/2012 | Or-Bach et al. |
| 9,412,840 B1 | 8/2016 | Leobandung et al. |
| 9,722,038 B2 | 8/2017 | Adusumilli et al. |
| 9,755,043 B2 | 9/2017 | Zhou et al. |
| 9,818,876 B1 | 11/2017 | Bouche |
| 10,062,692 B1 | 8/2018 | Ray et al. |
| 2010/0027311 A1 | 2/2010 | Kleint et al. |
| 2011/0233660 A1 | 9/2011 | Oota |
| 2011/0298045 A1 | 12/2011 | Kalnitsky et al. |
| 2015/0145027 A1 | 5/2015 | Lin et al. |
| 2017/0077256 A1 | 3/2017 | Adusumilli et al. |
| 2018/0102364 A1* | 4/2018 | Rastogi ................ H01L 27/092 |
| 2018/0190809 A1* | 7/2018 | Huang ................ H01L 23/485 |
| 2018/0247865 A1 | 8/2018 | Adusumilli et al. |
| 2019/0035634 A1 | 1/2019 | Adusumilli et al. |
| 2019/0096888 A1* | 3/2019 | Ko ................ H01L 29/66795 |
| 2020/0035549 A1 | 1/2020 | Wu |
| 2020/0035558 A1 | 1/2020 | Ching et al. |
| 2020/0105586 A1* | 4/2020 | Hsu ................ H01L 23/53257 |
| 2020/0119190 A1 | 4/2020 | Cheng et al. |
| 2020/0135871 A1* | 4/2020 | Tsai ................ H01L 21/76804 |

\* cited by examiner

100

US 11,626,287 B2

SEMICONDUCTOR DEVICE WITH IMPROVED CONTACT RESISTANCE AND VIA CONNECTIVITY

BACKGROUND

With the current trends in integrated circuit (IC) miniaturization, and increasingly smaller critical dimensions, it is desirable in semiconductor device technology to integrate many different functions on a single chip. In the IC chip fabrication industry, there are three sections referred to in a typical IC chip build: front end of the line (FEOL), back end of the line (BEOL) and the section that connects those two together, the middle of the line (MOL). The FEOL is made up of the semiconductor devices, e.g., transistors, the BEOL is made up of interconnects and wiring, and the MOL is an interconnect between the FEOL and BEOL that includes material to prevent the diffusion of BEOL metals to FEOL devices.

The FEOL transistor devices are typically processed using single crystal and polycrystalline silicon. The BEOL interconnects are typically made of multiple metals; the bulk of the conductor is copper. If copper diffuses into the FEOL silicon-based devices, it can cause shorting or alter sensitive transistor characteristics and render the semiconductor useless. This is the reason for the MOL connection. BEOL generally begins when the first layer of metal is deposited on the wafer. BEOL includes contacts, insulating layers (dielectrics), metal levels, and bonding sites for chip-to-package connections.

SUMMARY

Embodiments described herein provide methods of forming semiconductor devices.

For example, one exemplary embodiment includes a method for fabricating a semiconductor structure. The method comprises forming a semiconductor substrate having one or more fins. The method further comprises forming, over a portion of the one or more fins, a plurality of gate structures having sidewalls, wherein a channel region is located under each of the gate structures within the portion of the one or more fins. The method further comprises forming gate spacers on the sidewalls of the gate structures. The method further comprises forming a source/drain region in a recessed region of the semiconductor substrate between each adjacent gate spacer. The method further comprises depositing an interlevel dielectric layer on a top surface of each of the source/drain regions and over a top surface of the gate structures. The method further comprises depositing a hardmask on a top surface of the interlevel dielectric layer. The method further comprises patterning the hardmask to form a plurality of openings through the hardmask and interlevel dielectric layer exposing the top surface of each of the source/drain regions. The method further comprises depositing an optical planarization layer in a portion of each of the openings and above the top surface of the gate structures. The method further comprises isotropically etching the interlevel dielectric layer exposed in the opening above a top surface of the optical planarization layer to form an undercut region in the interlevel dielectric layer below the hardmask, wherein the undercut region defines an overhang structure.

Another exemplary embodiment includes a method for fabricating a semiconductor structure. The method comprises forming a semiconductor substrate having one or more fins. The method further comprises forming, over a portion of the one or more fins, a plurality of gate structures having sidewalls, wherein a channel region is located under each of the gate structures within the portion of the one or more fins. The method further comprises forming gate spacers on the sidewalls of the gate structures. The method further comprises forming a source/drain region in a recessed region of the semiconductor substrate between each adjacent gate spacer. The method further comprises depositing an interlevel dielectric layer on a top surface of each of the source/drain regions and over a top surface of the gate structures. The method further comprises depositing a hardmask on a top surface of the interlevel dielectric layer. The method further comprises patterning the hardmask to form a plurality of openings through the hardmask and interlevel dielectric layer exposing the top surface of each of the source/drain regions. The method further comprises depositing a silicide layer on the top surface of the exposed source/drain regions and on a portion of the interlevel dielectric layer. The method further comprises depositing a liner layer on a portion of the silicide layer and on a portion of the exposed surfaces of the interlevel dielectric layer and above the top surface of the gate structure. The method further comprises depositing a first conductive material on the silicide layer and the liner layer. The method further comprises isotropically etching the interlevel dielectric layer exposed in the opening above a top surface of the liner layer and the first conductive material to form an undercut region in the interlevel dielectric layer below the hardmask, wherein the undercut region defines an overhang structure.

Another exemplary embodiment includes a semiconductor device which comprises a semiconductor substrate having one or more fins. The semiconductor device further comprises a gate structure having opposing sidewalls. The gate structure located over the one or more fins. A channel is created under the gate structure within the one or more fins. The semiconductor device further comprises a gate spacer disposed on the opposing sidewalls of the gate structures. The semiconductor device further comprises a source/drain region disposed between adjacent gate spacers. The semiconductor device further comprises an interlevel dielectric layer disposed on a portion of the source/drain region and on sidewalls of the gate spacers and above a top surface of each of the gate spacers and gate structures, and defining an opening therein to the exposed top surface of the source/drain region. A width of the opening from a portion above the top surface of each of the gate spacers up to a top surface of the interlevel dielectric layer is greater than a width of the opening from the portion above the top surface of each of the gate spacers to the exposed top surface of the source/drain region.

These and other features, objects and advantages of the present invention will become apparent from the following detailed description of illustrative embodiments thereof, which is to be read in connection with the accompanying drawings.

DETAILED DESCRIPTION

Figure 1:
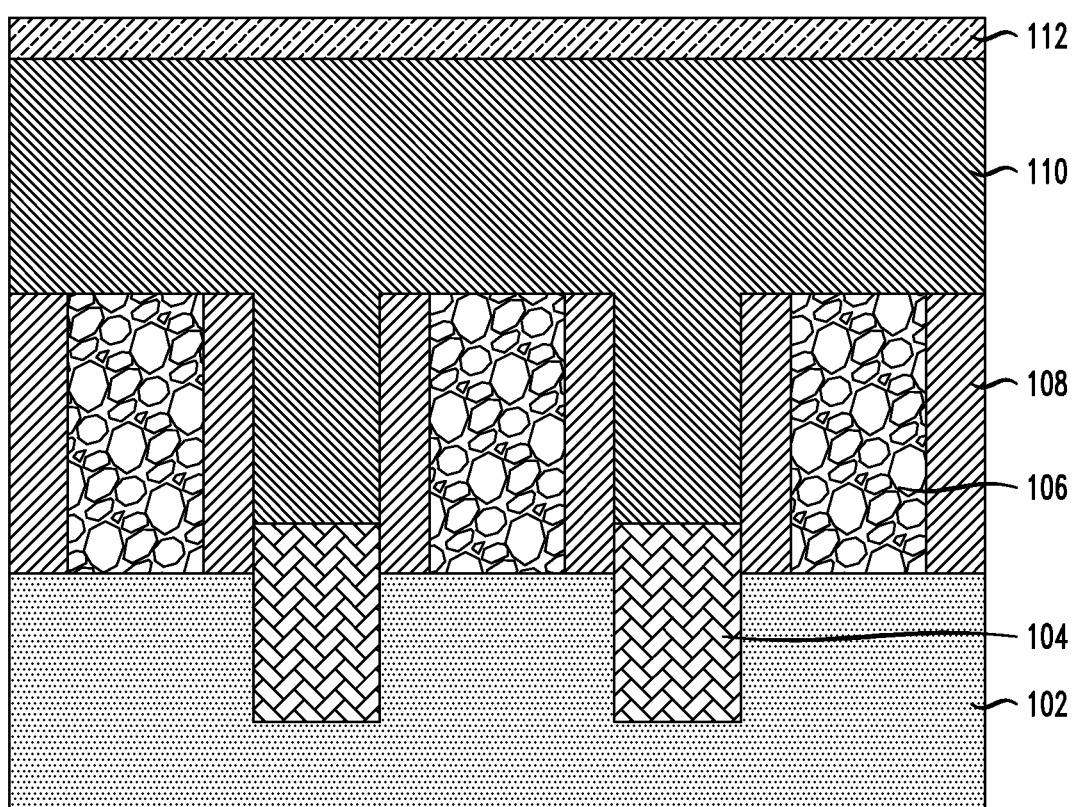
FIG. 1 is a cross sectional view of a semiconductor device through the fin width at a first-intermediate fabrication stage, according to an illustrative embodiment.

The present application generally relates to transistors, and more particularly to semiconductor devices and methods for their fabrication.

As pitch and semiconductor contact via (CA) critical dimensions (CD) further scale, two issues arise. First, CA vertical resistance is increased. Second, the CA top CD for via landing is too small. Thus, if there is any misalignment between a via and a CA, then there is a high via-to-CA resistance. Accordingly, it would be desirable to fabricate a semiconductor device having an improved CA resistance and via connectivity.

It is to be understood that the various layers, structures, and regions shown in the accompanying drawings are schematic illustrations that are not drawn to scale. In addition, for ease of explanation, one or more layers, structures, and regions of a type commonly used to form semiconductor devices or structures may not be explicitly shown in a given drawing. This does not imply that any layers, structures, and regions not explicitly shown are omitted from the actual semiconductor structures.

Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

Moreover, the same or similar reference numbers are used throughout the drawings to denote the same or similar features, elements, or structures, and thus, a detailed explanation of the same or similar features, elements, or structures will not be repeated for each of the drawings. It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error may be present, such as 1% or less than the stated amount.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment. The term "positioned on" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

It will be understood that, although the terms first, second, etc. may be used herein to describe various elements, these elements should not be limited by these terms. These terms are only used to distinguish one element from another element. Thus, a first element discussed below could be termed a second element without departing from the scope of the present concept.

As used herein, "height" refers to a vertical size of an element (e.g., a layer, trench, hole, opening, etc.) in the cross-sectional views measured from a bottom surface to a top surface of the element, and/or measured with respect to a surface on which the element is located. Conversely, a "depth" refers to a vertical size of an element (e.g., a layer, trench, hole, opening, etc.) in the cross-sectional views measured from a top surface to a bottom surface of the element. Terms such as "thick", "thickness", "thin" or derivatives thereof may be used in place of "height" where indicated.

As used herein, "width" or "length" refers to a size of an element (e.g., a layer, trench, hole, opening, etc.) in the drawings measured from a side surface to an opposite surface of the element. Terms such as "thick", "thickness", "thin" or derivatives thereof may be used in place of "width" or "length" where indicated.

Illustrative embodiments for forming a semiconductor device will be described below with reference to FIGS. 1-11. Note that the same reference numeral (100) is used to denote the semiconductor structure through the various intermediate fabrication stages illustrated in FIGS. 1 through 11. Note also that the semiconductor structure described herein can also be considered to be a semiconductor device and/or an integrated circuit, or some part thereof. For the purpose of clarity, some fabrication steps leading up to the production of the semiconductor structure as illustrated in FIGS. 1-11 are omitted. In other words, one or more well-known processing steps which are not illustrated but are well-known to those of ordinary skill in the art have not been included in the figures.

FIG. 1 illustrates a cross-sectional view of semiconductor structure 100 through the fin width at a first-intermediate fabrication stage. Semiconductor structure 100 in FIG. 1 is shown comprising semiconductor substrate 102 with at least one fin (not shown). In one embodiment, the semiconductor substrate 102 is comprised of, for example, silicon (Si). In another embodiment, the semiconductor substrate is comprised of a semiconductor material including, but not limited to, silicon, germanium, a silicon-germanium alloy, a silicon carbon alloy, a silicon-germanium-carbon alloy, gallium arsenide, indium arsenide, indium phosphide, group III-V compound semiconductor materials, group II-VI compound semiconductor materials, organic semiconductor materials, or other compound semiconductor materials. However, the semiconductor substrate may be comprised of any material suitable for use in accordance with the embodiments described herein.

Semiconductor structure 100 further includes source/drain regions 104 between adjacent gate structures 106 and in contact with the substrate 102 (or counter-doped layer if formed), wherein a channel region is located under the gate structure. The substrate 102 may be anisotropically recessed to form source/drain regions 104. Source/drain regions 104 are formed, for example, in the P-FET and N-FET regions, respectively, around the fin. However, source/drain regions 104 can be formed in only P-FET regions or N-FET regions around the fin. The source/drain regions 104 can be formed by bottom-up epitaxial growth processes during epitaxial growth. The source/drain regions 104 are grown in separate or simultaneous epitaxial processes from each other to a desired height (thickness) such as, for example, about 25 nm to about 80 nm.

The epitaxially grown source/drain regions 104 can be in-situ doped, meaning dopants are incorporated into the epitaxy film during the epitaxy process. Other alternative doping techniques can be used, including but not limited to, for example, ion implantation, gas phase doping, plasma doping, plasma immersion ion implantation, cluster doping, infusion doping, liquid phase doping, solid phase doping, etc. Suitable dopants include, for example, an n-type dopant selected from a group of phosphorus (P), arsenic (As) and antimony (Sb), or a p-type dopant selected from a group of boron (B), gallium (Ga), indium (In), and thallium (Tl) at various concentrations. For example, in a non-limiting example, a dopant concentration range may be $1 \times 10^{18}/cm^3$ to $1 \times 10^{21}/cm^3$. According to an embodiment, the bottom source/drain regions 104a and 104b can include a boron doped SiGe, or a phosphorous doped silicon.

Terms such as "epitaxial growth and/or deposition" and "epitaxially formed and/or grown" refer to the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation. In some embodiments, epitaxial growth and/or deposition processes are selective to forming on a semiconductor surface, and do not deposit material on dielectric surfaces, such as silicon dioxide or silicon nitride surfaces.

Examples of various epitaxial growth processes include, for example, rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for an epitaxial deposition process can range from 500° C. to 900° C. Although higher temperature typically results in faster deposition, the faster deposition may result in crystal defects and film cracking.

Gate structures 106 may include a high-K metal gate structure having, for example, a high-k dielectric layer that is formed over a region of the surface of the fin, a metallic layer formed over the high-k dielectric layer and a gate electrode formed over the metallic layer (not shown). The high-k dielectric layer may include, for example, a high-K metal oxide based material such as, but not limited to, $HfO_2$, $ZrO_2$, $La_2O_3$, $Al_2O_3$, $TiO_2$, $SrTiO_3$, $LaAlO_3$, $Y_2O_3$, $HfO_3N_y$, $ZrO_xN_y$, $La_2O_xN_y$, $Al_2O_xN_y$, $TiO_xN_y$, $SrTiO_xN_y$, $LaAlO_xN_y$, or $Y_2O_xN_y$. The metallic layer may, for example, include a titanium nitride (TiN) layer. During a gate process, the gate electrode may include a polysilicon material that is subsequently removed (i.e., via an etch process) and replaced (i.e., via a deposition process) by a metal fill material such as, for example, aluminum (Al) or tungsten (W).

Gate structures 106 further include gate spacers 108 on the sidewalls of the gate structure. The gate spacers 108 may be formed on the sidewalls of gate structure 106 by, for example, low pressure chemical vapor deposition (LPCVD) of a dielectric layer. The gate spacer 108 may protect the gate structure 106 (i.e., High-K metal gate structure) and electrically isolate the gate electrode from electrical crosstalk that may occur with any electrical contacts that are formed with respect to subsequently grown epitaxially source/drain regions 104 as discussed above. Suitable material for gate spacers 108 includes, for example, a dielectric material. For example, the dielectric materials used to form the gate spacers 108 may include silicon oxide, silicon nitride, silicon oxynitride, SiOCN, SiBCN, SiCO, etc.

Semiconductor structure 100 further includes an inter-level dielectric (ILD) layer 110 deposited in the openings between gate structures 106 on the top surface bottom source/drain regions 104 and over top surfaces of gate structures 106. The ILD layer 110 may include any suitable dielectric material, for example, silicon oxide, silicon nitride, hydrogenated silicon carbon oxide, silicon based low-k dielectrics, flowable oxides, porous dielectrics, or organic dielectrics including porous organic dielectrics. The ILD layer 110 may be formed using any suitable deposition techniques including chemical vapor deposition (CVD), atomic layer deposition (ALD), plasma enhanced chemical vapor deposition (PECVD), physical vapor deposition (PVD), chemical solution deposition or other like processes. ILD layer 110 is then planarized by, for example, a planarization process such as a chemical mechanical planarization (CMP). As one skilled in the art will understand, in a replacement gate process flow, the bottom portion of the ILD, which is between the gate spacers 108, is formed after the source/drain epitaxial growth. The upper portion of the ILD will then be formed later after the replacement high-k/metal gate CMP.

Sacrificial hardmask layer 112 is deposited on the top surface of ILD layer 110. The sacrificial hardmask layer 112 comprises, for example, titanium nitride (TiN), titanium oxide (TiOx), and silicon nitride (SiN). The sacrificial hardmask layer 112 may be formed using any suitable deposition techniques such as CVD, PVD and the like. Sacrificial hardmask layer 112 advantageously assists in maintaining the height of the ILD 110 in subsequent processing steps as discussed below.

Figure 2:
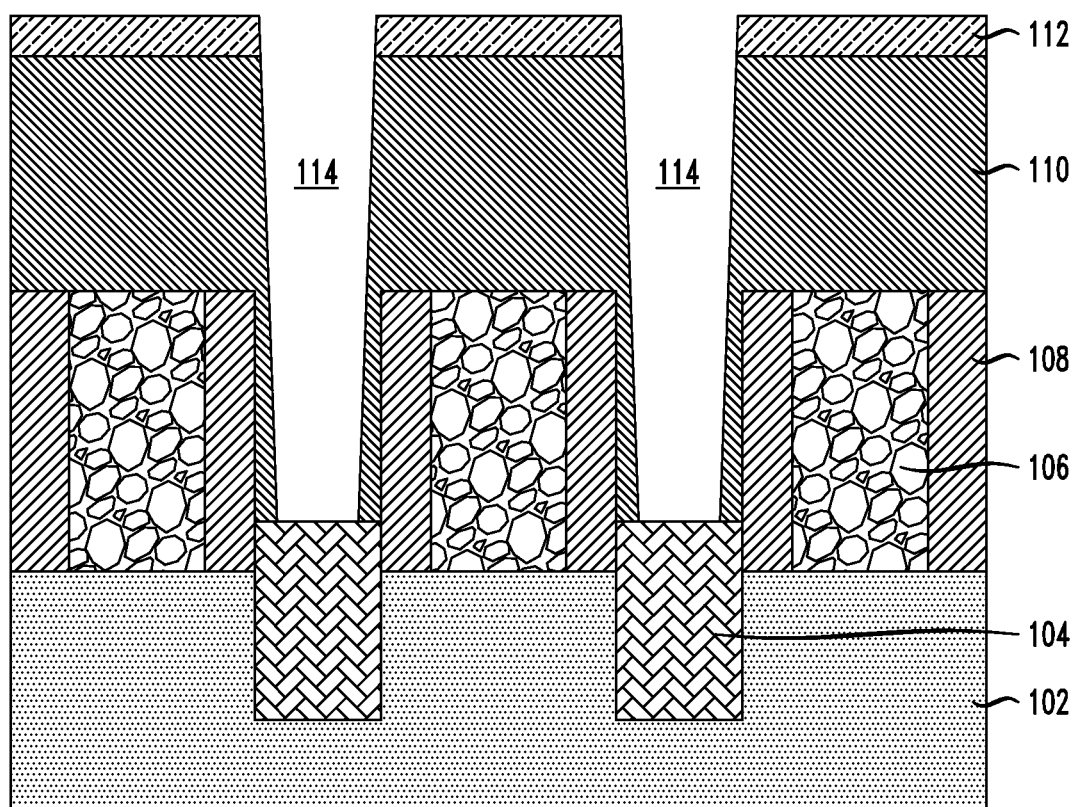
FIG. 2 is a cross sectional view of a semiconductor device through the fin width at a second-intermediate fabrication stage, according to an illustrative embodiment.

FIG. 2 illustrates a cross-sectional view of semiconductor structure 100 at a second-intermediate fabrication stage. During this stage, conductive vias or trenches 114 are formed by methods known in the art, e.g., lithography patterning (patterning mask not shown, as it is removed after the etch is done) followed by etching through the sacrificial hardmask layer 112 and ILD layer 110 and exposing the top surface of bottom source/drain regions 104 by, for example, reactive ion etching (RIE). Accordingly, the via is communicative with the respective component, e.g., conductive vias or trenches communicative with the respective bottom source/drain regions 104.

Figure 3:
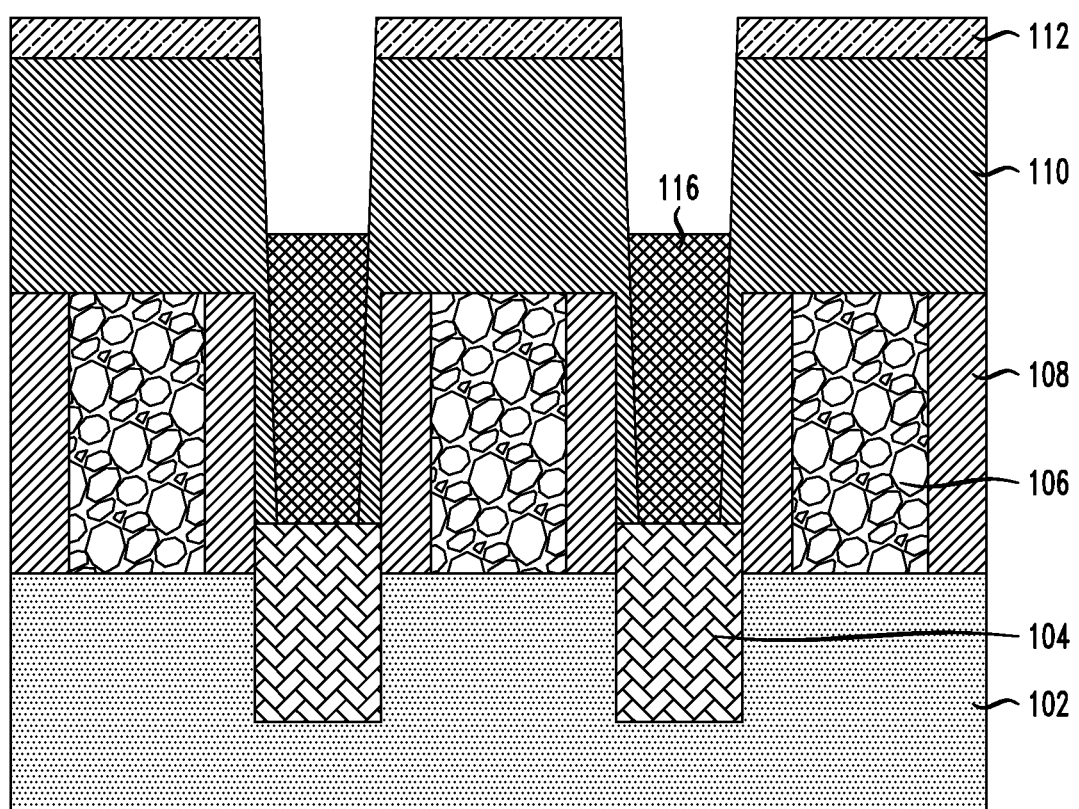
FIG. 3 is a cross sectional view of a semiconductor device through the fin width at a third-intermediate fabrication stage, according to an illustrative embodiment.

FIG. 3 illustrates a cross-sectional view of semiconductor structure 100 at a third-intermediate fabrication stage. During this stage, an optical planarization layer (OPL) 116 is deposited in vias 114 and over the top surface of sacrificial hardmask layer 112 using traditional techniques for forming such materials, e.g., spin-coating, deposition, etc. Next, the OPL 116 is recessed to a portion above the top surfaces of gate structure 106 and gate spacers 108 by conventional techniques, e.g., a directional etching technique.

Figure 4:
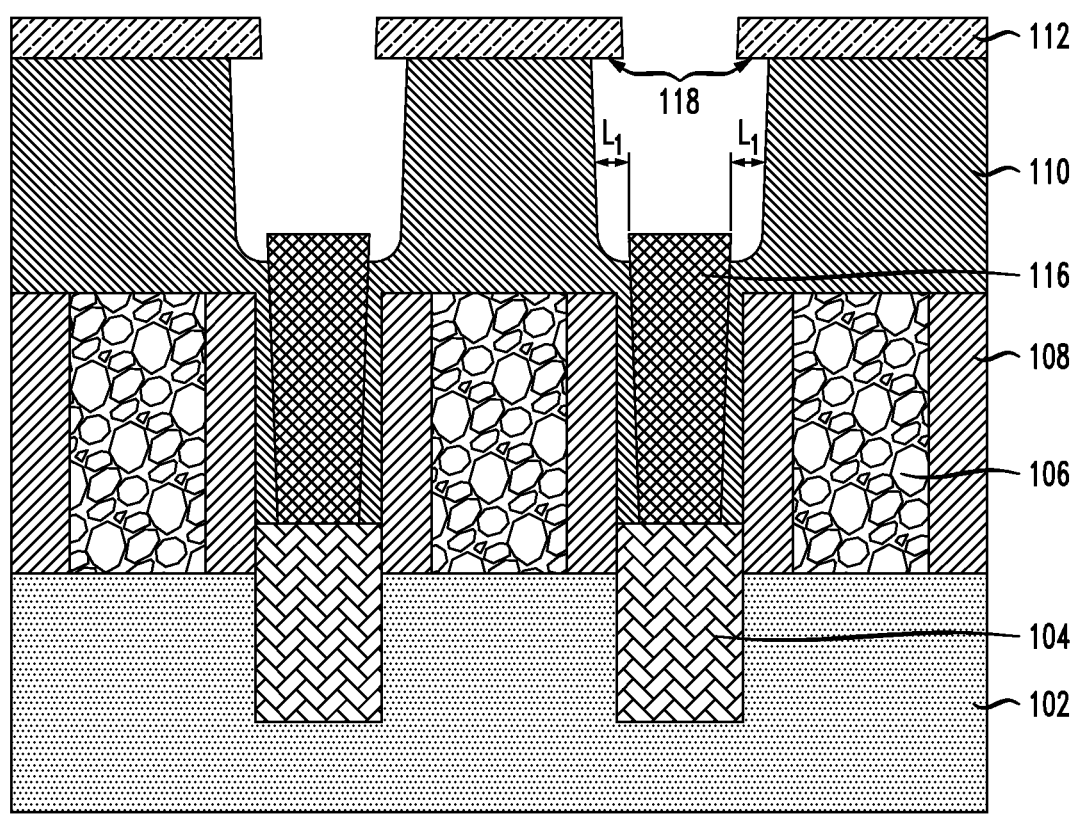
FIG. 4 is a cross sectional view of a semiconductor device through the fin width at a fourth-intermediate fabrication stage, according to an illustrative embodiment.

FIG. 4 illustrates a cross-sectional view of semiconductor structure 100 at a fourth-intermediate fabrication stage. During this stage, the exposed portion of the ILD 110 is laterally etched to form an undercut in the ILD 110 below the sacrificial hardmask layer 112 thereby forming the sacrificial overhang structure 118. In one embodiment of the invention, the ILD 110 is laterally etched to achieve an undercut length Li of about 1 nm to about 5 nm, for example, which creates a small sacrificial overhang structure 118 that is sufficient to increase the critical dimensions of the via in forming a MOL via. The ILD 110 is laterally etched by carrying out an isotropical etching technique such as an atomic layer etching that is selective to ILD 110, and not sacrificial hardmask layer 112 and OPL 116.

Figure 5:
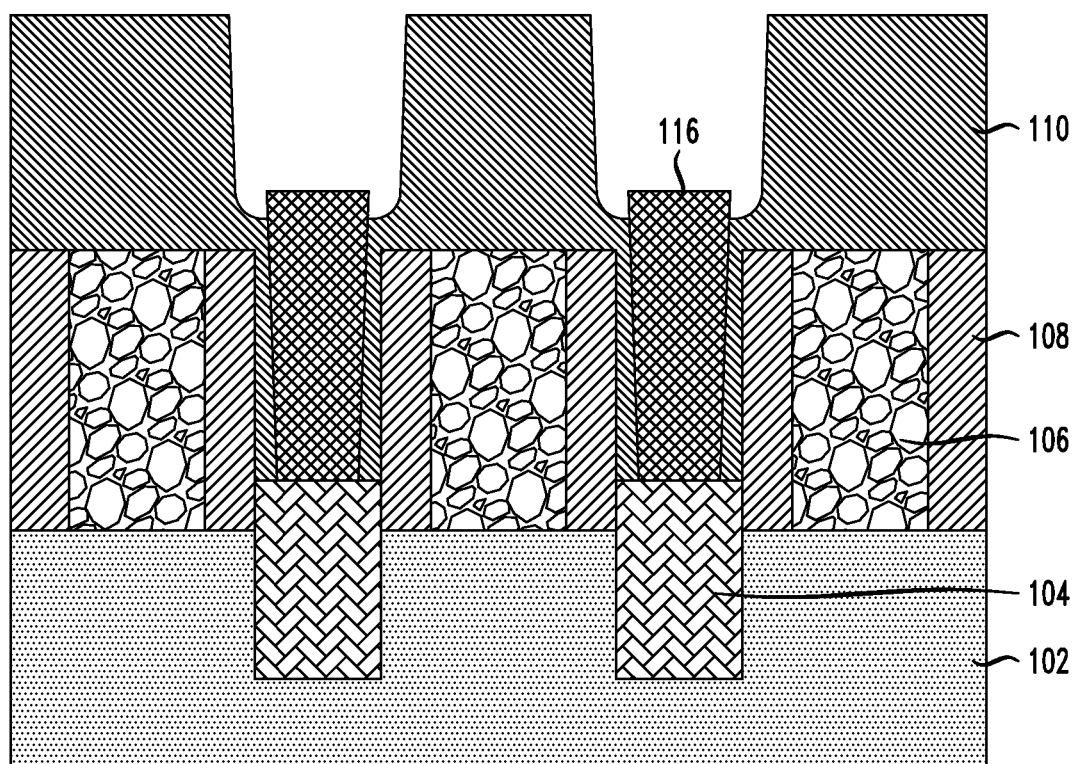
FIG. 5 is a cross sectional view of a semiconductor device through the fin width at a fifth-intermediate fabrication stage, according to an illustrative embodiment.

FIG. 5 illustrates a cross-sectional view of semiconductor structure 100 at a fifth-intermediate fabrication stage. During this stage, sacrificial hardmask layer 112 is then removed by any suitable etching process known in the art capable of selectively removing the sacrificial hardmask layer 112 without substantially removing material from the ILD 110 and OPL 116. In an exemplary embodiment, the sacrificial hardmask layer 112 may be removed, for example, by a RIE or wet clean process.

Figure 6:
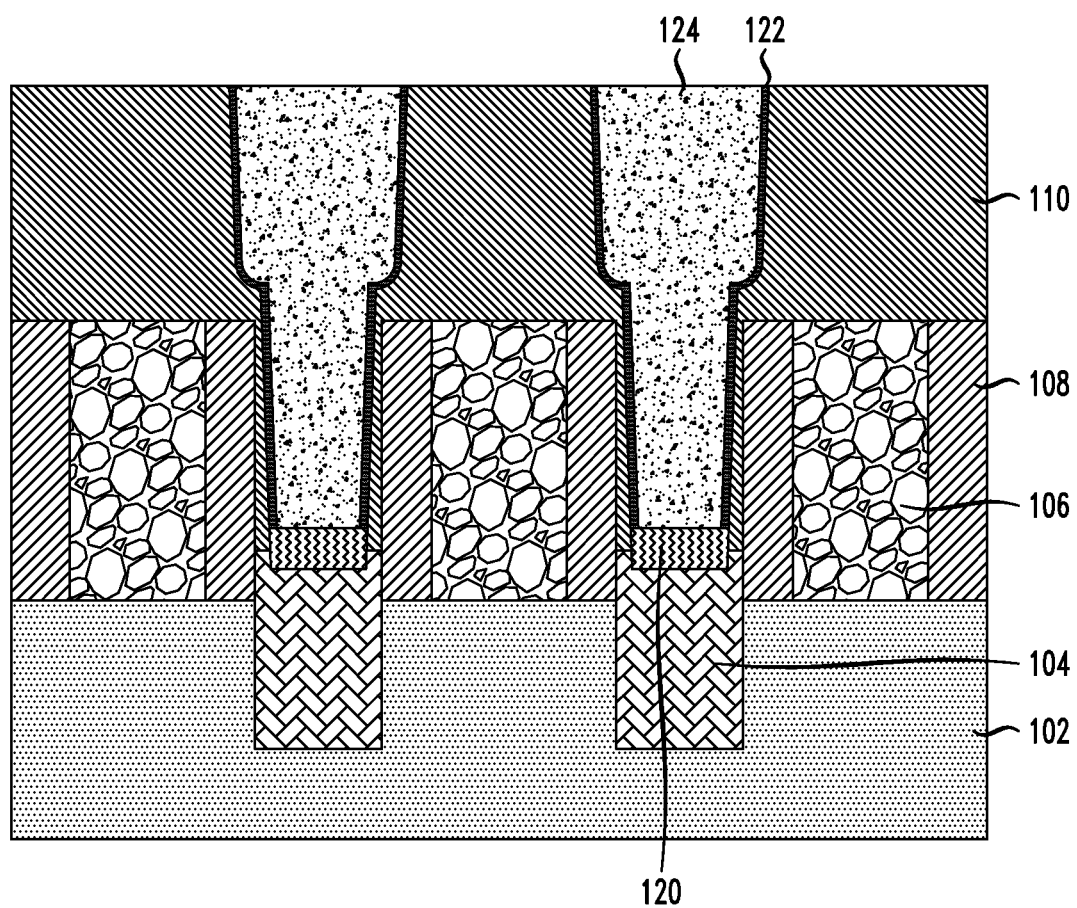
FIG. 6 is a cross sectional view of a semiconductor device through the fin width at a sixth-intermediate fabrication stage, according to an illustrative embodiment.

FIG. 6 illustrates a cross-sectional view of semiconductor structure 100 at a sixth-intermediate fabrication stage. During this stage, OPL 116 is removed using various etching processes such as, for example, a plasma ash etching process. The plasma ash etching process may be selective to both the material of the ILD 110 and the bottom source/drain regions 104. Accordingly, the source/drain regions 104 are maintained, and includes a recessed upper region (not shown). Next, following the exposure of source/drain regions 104, a silicide liner 120 is formed at the top surface of the exposed source/drain regions 104 to reduce contact resistance at the interface between source/drain and contacts to be formed thereupon. For example, silicide liner 120 can be deposited in the openings and on top of other exposed source/drain regions 104 with a layer of suitable metal material such as Ti or TiN that is pre-determined or desired to form the silicide, and subsequently subjecting the metal layer to an environment of suitable temperature to cause reaction of the metal material with underneath silicon thereby forming silicide liner 120.

Next, a layer of suitable lining material 122 may be optionally deposited on the exposed surfaces of ILD 110 and silicide liner 120. The lining material may be, for example, titanium nitride, although other material may be used as well. The lining material may be deposited by any conventional deposition technique such as CVD, a sputter deposition process, or any other technique. The deposited liner 122 may be conductive, in direct contact with and covering silicide liner 120 in the source/drain regions 104. The lining layer 122 may provide improved contact of a later formed contact stud to underneath silicide to help improve conductivity to the source/drain regions. In the meantime, lining layer 122 may function as a barrier layer as well as to prevent material of contact stud, such as tungsten (W), from penetrating or getting into underneath source/drain regions of the semiconductor structure 100.

A conductive material 124 is then deposited within the opening to form source/drain contacts. The conductive material can include any suitable conductive material including, for example, polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotube, conductive carbon, graphene, or any suitable combination of these materials. The conductive material can further include dopants that are incorporated during or after deposition. The depositing step may be followed by or accompanied with an annealing step.

Figure 7:
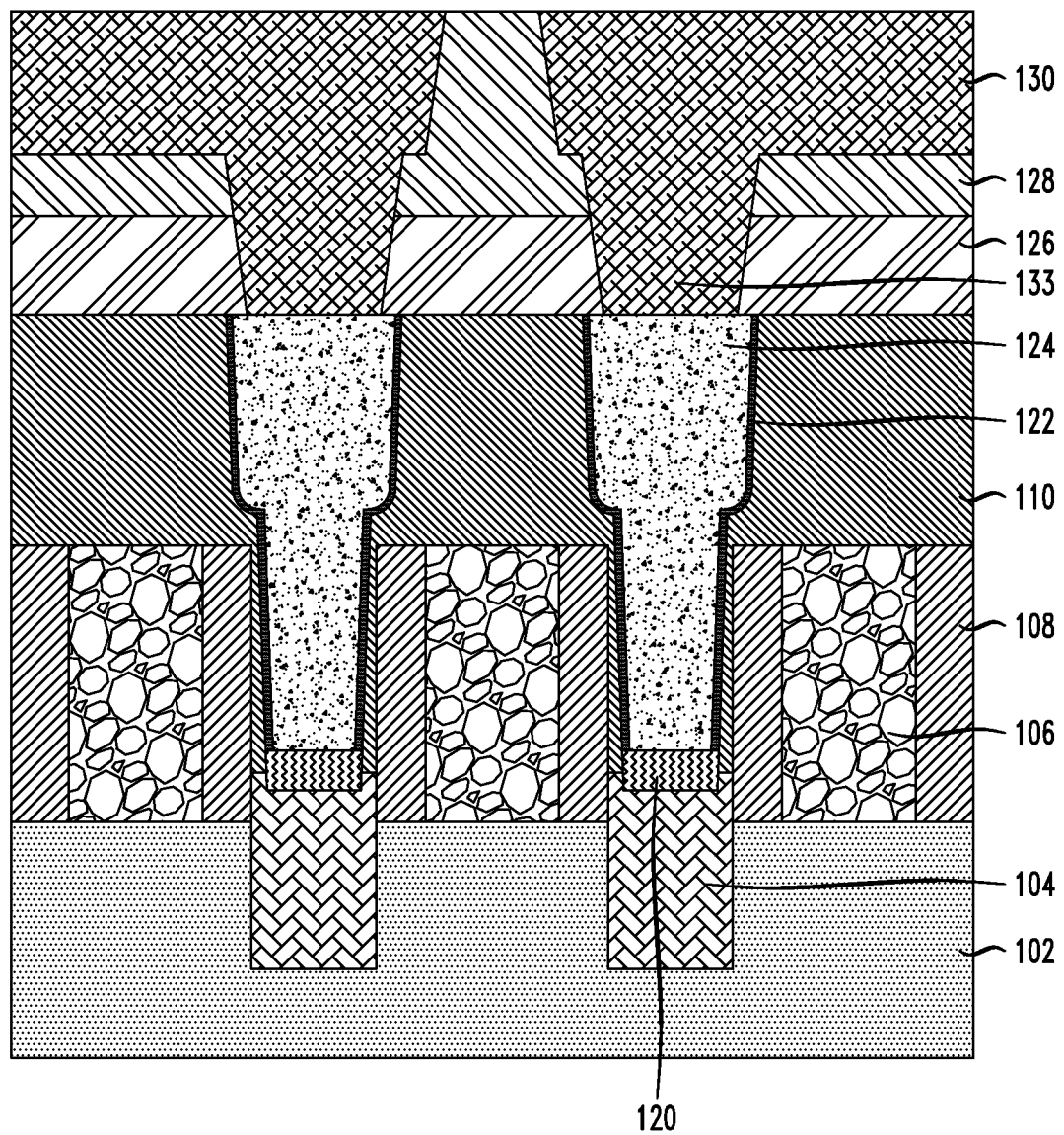
FIG. 7 is a cross sectional view of a semiconductor device through the fin width at a seventh-intermediate fabrication stage, according to an illustrative embodiment.

FIG. 7 illustrates a cross-sectional view of semiconductor structure 100 at a seventh-intermediate fabrication stage. During this stage, capping layer 126 is deposited on the top surface of the ILD 110, liner layer 122 and conductive material 124 and then planarized by, for example, CMP. The capping layer 126 comprises, for example, a nitride material such as SiN. Next, a low-k dielectric layer 128 is deposited on capping layer 126. Suitable low-k dielectric material includes, for example, silicon oxide, hydrogenated silicon carbon oxide (SiCOH), SiCH, SiCNH, or other types of silicon based low-k dielectrics (e.g., k less than about 4.0). The low-k dielectric layer 128 may be deposited using known methods such as, for example, ALD, CVD, PVD, electroplating, or electroless plating.

Next, a metallization layer 130 and metal via 133 are formed to connect with the conductive material 124. Metallization layer 130 and via 133 are formed by conventional techniques such as patterning the low-k dielectric layer 128 and forming a trench through low-k dielectric layer 128 and forming via 133 through capping layer 126. A conductive material is then deposited in the via 133 and the trench to form the metallization layer 130. The conductive material includes, for example, aluminum (Al), tungsten (W), copper (Cu) or cobalt (Co) or other suitable types of conductive material.

Figure 8:
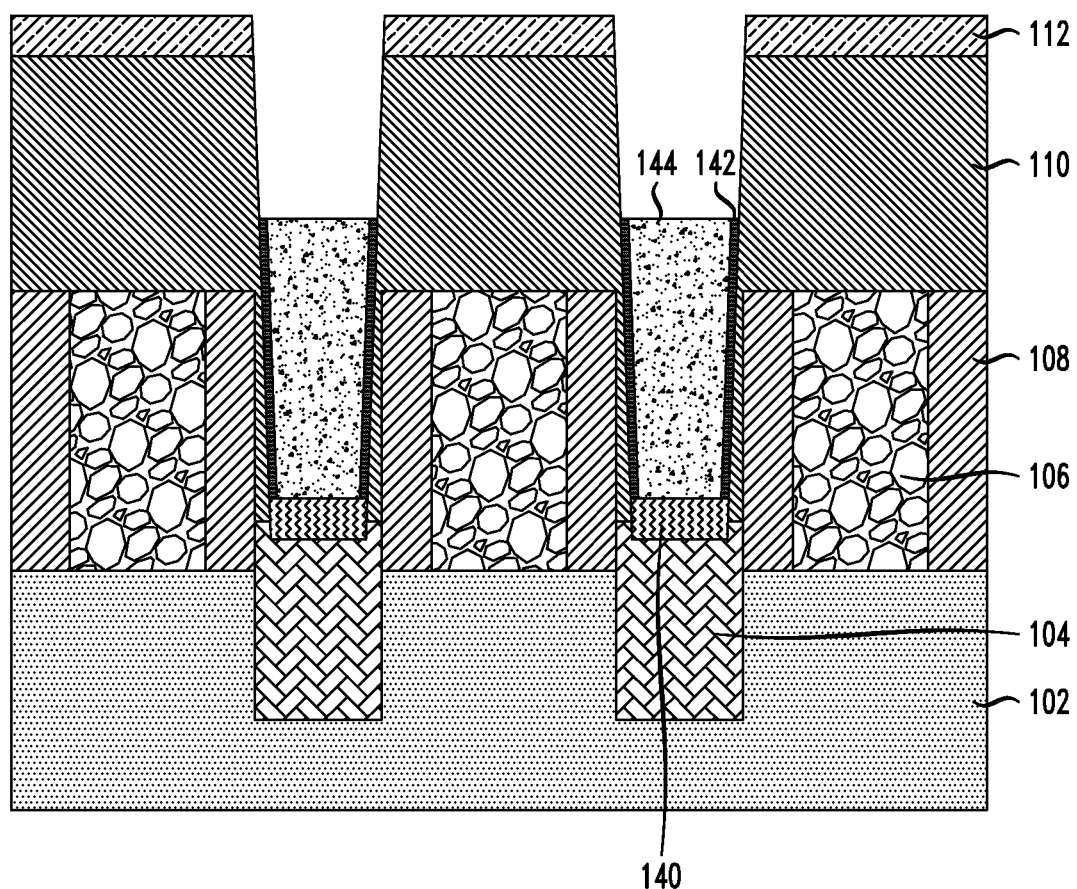
FIG. 8 is a cross sectional view of a semiconductor device through the fin width at a first-intermediate fabrication stage following the fabrication stage of FIG. 2, according to an alternative illustrative embodiment.

FIGS. 8-11 illustrate an alternate embodiment starting with the semiconductor structure 100 shown in FIG. 2. First, as shown in FIG. 8, following formation of conductive vias or trenches 114 (see FIG. 2) and exposing source/drain regions 104, a silicide liner 140 is formed at the top surface of the exposed source/drain regions 104 to reduce contact resistance at the interface between source/drain and contacts to be formed thereupon. For example, silicide liner 140 can be deposited in the conductive vias or trenches 114 and on top of other exposed source/drain regions 104 with a layer of suitable metal material. The silicide layer 140 can be of the similar material as silicide layer 120 and deposited in a similar manner. Next, a layer of suitable lining material 142 may be optionally deposited on silicide layer 140 and on a portion of the exposed surfaces of ILD 110 and above the top surfaces of gate structures 106 and gate spacers 108. The lining material 142 can be of a similar material as lining material 122, and deposited in a similar manner. A conductive material 144 is then deposited within the via 114 and up to a top surface of lining material 142. The conductive material 144 can be of a similar material as conductive material 124 and deposited in a similar manner. Next, a CMP step is performed to planarize the metal liner 142 and conductive metal 144, followed by metal recess such that top surface of metal 144 is above top surface of gate 106.

Figure 9:
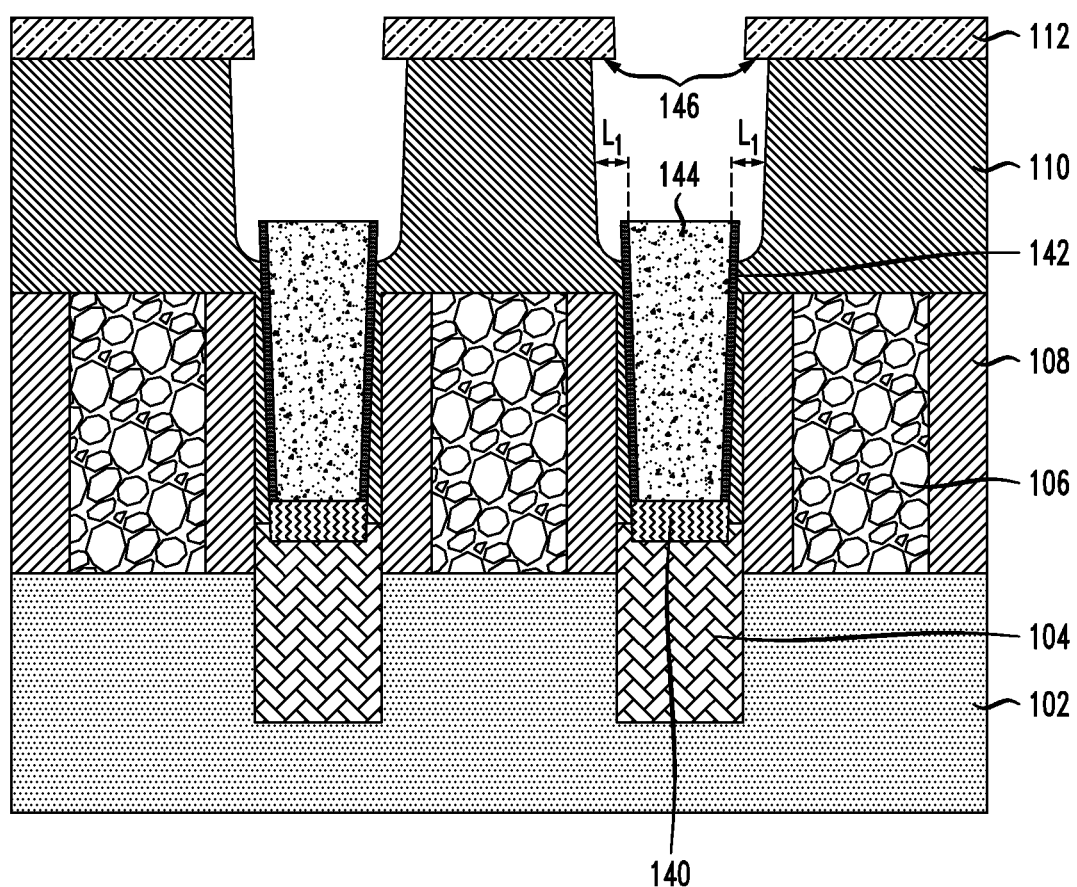
FIG. 9 is a cross sectional view of a semiconductor device through the fin width at a second-intermediate fabrication stage, according to an alternative illustrative embodiment.

FIG. 9 illustrates a cross-sectional view of semiconductor structure 100 at a second-intermediate fabrication stage of the alternative embodiment. During this stage, the exposed portion of the ILD 110 is laterally etched to form an undercut in the ILD 110 below the sacrificial hardmask layer 112 thereby forming the sacrificial overhang structure 146. In one embodiment of the invention, the ILD 110 is laterally etched to achieve an undercut length Li of about 1 nm to about 5 nm, for example, which creates a small sacrificial overhang structure 146 that is sufficient to increase the critical dimensions of the via in forming a MOL via. The ILD 110 is laterally etched by carrying out an isotropically etching technique such as an atomic layer etching that is selective to ILD 110, and not sacrificial hardmask layer 112, lining material 142 and conductive material 144.

Figure 10:
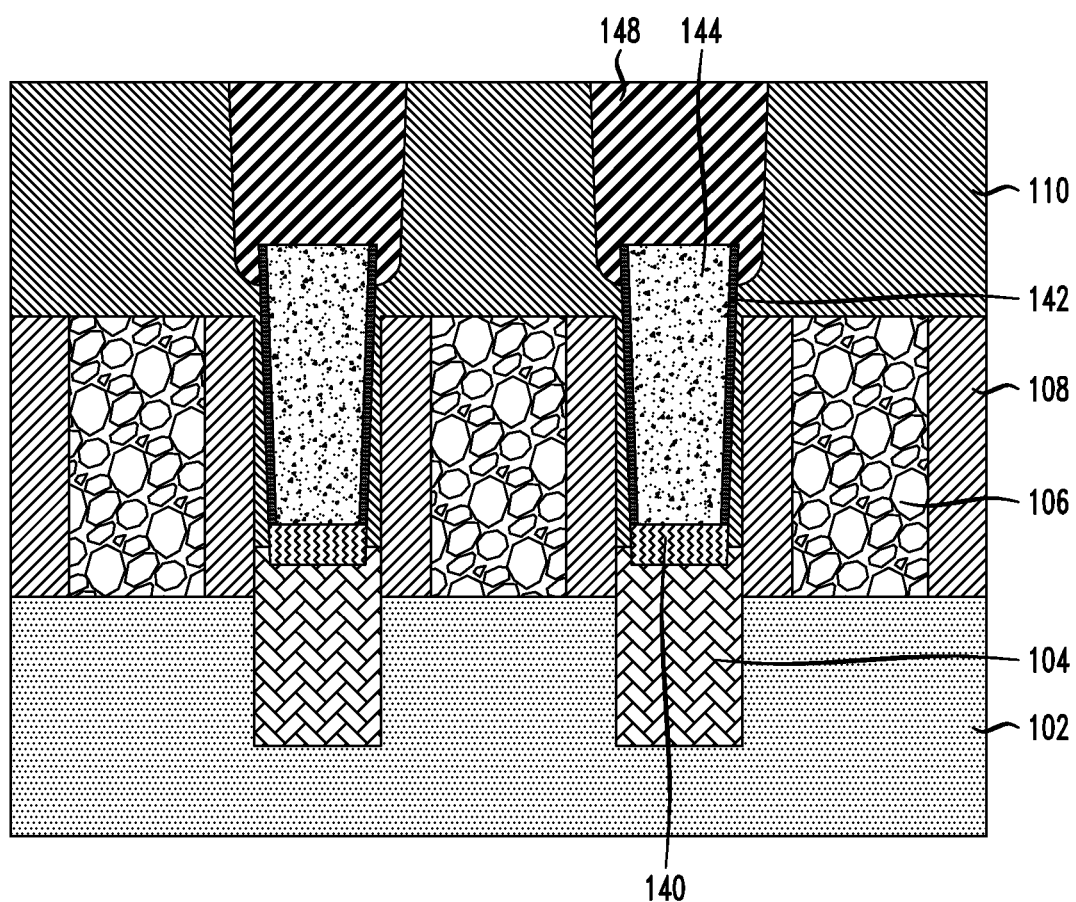
FIG. 10 is a cross sectional view of a semiconductor device through the fin width at a third-intermediate fabrication stage, according to an alternative illustrative embodiment.

FIG. 10 illustrates a cross-sectional view of semiconductor structure 100 at a third-intermediate fabrication stage of the alternative embodiment. During this stage, the sacrificial layer 112 is removed, then a second conductive material 148 is selectively grown on the top surfaces of lining material 142 and conductive material 144 and filling the opening. The second conductive material 148 can of the same or different conduct material as conductive material 144 and deposited in a similar manner. If necessary, second conductive material 148 can then be planarized by, for example, CMP. One advantage of this embodiment is that it is not necessary to include a metal liner for second conductive material 148 because it is grown selective over conductive material 144, which further reduces the metal resistance.

Figure 11:
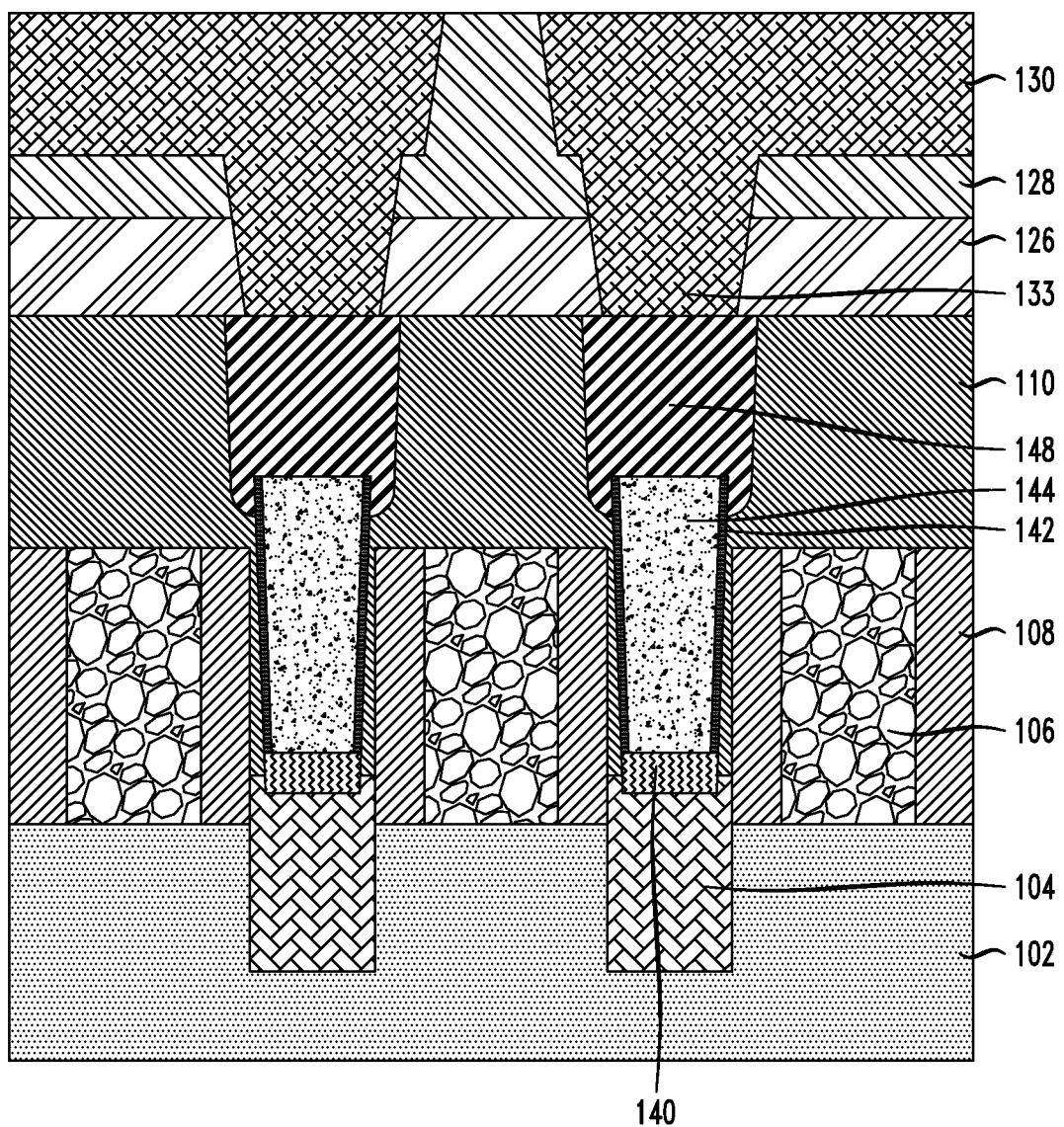
FIG. 11 is a cross sectional view of a semiconductor device through the fin width at a fourth-intermediate fabrication stage, according to an alternative illustrative embodiment.

FIG. 11 illustrates a cross-sectional view of semiconductor structure 100 at a fourth-intermediate fabrication stage. During this stage, capping layer 126 is deposited on the top surface of the ILD 110, liner layer 142 and conductive material 144 and then planarized by, for example, CMP. The capping layer 126 comprises, for example, a nitride material such as SiN. Next, a low-k dielectric layer 128 is deposited on capping layer 126. Suitable low-k dielectric material includes, for example, silicon oxide, hydrogenated silicon carbon oxide (SiCOH), SiCH, SiCNH, or other types of silicon based low-k dielectrics (e.g., k less than about 4.0). The low-k dielectric layer 128 may be conformally deposited using known methods such as, for example, ALD, CVD, PVD, electroplating, or electroless plating.

Next, a metallization layer 130 and metal via 133 are formed to connect with the conductive material 124. Metallization layer 130 and metal via 133 are formed by conventional techniques such as patterning the low-k dielectric layer 128 and forming a trench through low-k dielectric layer 128 and forming via 133 through capping layer 126. A conductive material is then deposited in the via 133 and the trench to form the metallization layer 130. The conductive material includes any of the conductive material discussed above.

It is to be further understood that the methods discussed herein for fabricating semiconductor structures can be incorporated within semiconductor processing flows for fabricating other types of semiconductor devices and integrated circuits with various analog and digital circuitry or mixed-signal circuitry. In particular, integrated circuit dies can be fabricated with various devices such as transistors, diodes, capacitors, inductors, etc. An integrated circuit in accordance with embodiments can be employed in applications, hardware, and/or electronic systems. Suitable hardware and systems for implementing embodiments of the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein.

Furthermore, various layers, regions, and/or structures described above may be implemented in integrated circuits (chips). The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Although illustrative embodiments have been described herein with reference to the accompanying drawings, it is to be understood that the invention is not limited to those precise embodiments, and that various other changes and modifications may be made by one skilled in art without departing from the scope or spirit of the invention.

What is claimed is:
1. A semiconductor structure, comprising:
 a semiconductor substrate having one or more fins;
 a plurality of gate structures having opposing sidewalls, the gate structures disposed over the one or more fins, wherein a channel is configured under the gate structures within the one or more fins;
 a gate spacer disposed on the opposing sidewalls of the gate structures;
 a source/drain region disposed between adjacent gate spacers;
 an interlevel dielectric layer disposed on a portion of the source/drain region and on sidewalls of the gate spacers and above a top surface of each of the gate spacers and gate structures, the interlevel dielectric layer configured to define an opening therein extending from a top surface of the source/drain region, wherein a first width of the opening from a portion above the top surface of each of the gate spacers up to a top surface of the interlevel dielectric layer is greater than a second width of the opening from the portion above the top surface of each of the gate spacers to the top surface of the source/drain region, the first width being indented inwards in the interlevel dielectric layer relative to the second width; and a liner layer disposed on sidewalls of the interlevel dielectric layer in the portion of the opening having the first width from the portion above the top surface of each of the gate spacers to the top surface of the source/drain region; wherein a top surface of outer ends of the liner layer is below the top surface of the interlevel dielectric layer.

2. The semiconductor structure of claim 1, further comprising:

a silicide layer disposed on the top surface of the source/drain region and on a portion of the interlevel dielectric layer.

3. The semiconductor structure of claim 2, wherein the liner layer is disposed on a portion of the silicide layer.

4. The semiconductor structure of claim 3, further comprising:

a conductive material disposed on the silicide layer and the liner layer and filling the opening.

5. The semiconductor structure of claim 4, further comprising a metallization layer disposed on a top surface of a via and configured to connect with the conductive material through the via.

6. The semiconductor structure of claim 3, wherein the silicide layer is a metal silicide layer, and the liner layer comprises a nitride.

7. The semiconductor structure of claim 1, wherein the semiconductor substrate comprises silicon.

8. The semiconductor structure of claim 1, wherein the gate structures comprise a high-K dielectric material.

9. A semiconductor structure comprising:

a semiconductor substrate having one or more fins;

a plurality of gate structures having opposing sidewalls, the gate structures disposed over the one or more fins, wherein a channel is configured under the gate structures within the one or more fins;

a gate spacer disposed on the opposing sidewalls of the gate structures;

a source/drain region disposed between adjacent gate spacers; and an interlevel dielectric layer disposed on a portion of the source/drain region and on sidewalls of the gate spacers and above a top surface of each of the gate spacers and gate structures, the interlevel dielectric layer configured to define an opening therein extending from a top surface of the source/drain region, wherein a first width of the opening from a portion above the top surface of each of the gate spacers up to a top surface of the interlevel dielectric layer is greater than a second width of the opening from the portion above the top surface of each of the gate spacers to the top surface of the source/drain region, a silicide layer disposed on the source/drain region and on a portion of the interlevel dielectric layer;

a liner layer disposed on a portion of the silicide layer and on a portion of the interlevel dielectric layer and above the top surface of the gate spacer;

a first conductive material disposed on the silicide layer and the liner layer; and a second conductive material disposed on the first conductive material and the liner layer;

wherein the first conductive material and the second conductive material are the same conductive material.

10. The semiconductor structure of claim 9, wherein the semiconductor substrate comprises silicon.

11. The semiconductor structure of claim 9, wherein the gate structures comprise a high-K dielectric material.

12. The semiconductor structure of claim 11, wherein the gate structures further comprise a metallic material.

13. The semiconductor structure of claim 9, further comprising a metallization layer disposed on a top surface of a via and configured to connect with the second conductive material through the via.

14. An integrated circuit comprising one or more semiconductor structures, wherein at least one of the semiconductor structures comprises:

a semiconductor substrate having one or more fins;

a plurality of gate structures having opposing sidewalls, the gate structures disposed over the one or more fins, wherein a channel is configured under the gate structures within the one or more fins;

a gate spacer disposed on the opposing sidewalls of the gate structures;

a source/drain region disposed between adjacent gate spacers;

an interlevel dielectric layer disposed on a portion of the source/drain region and on sidewalls of the gate spacers and above a top surface of each of the gate spacers and gate structures, the interlevel dielectric layer configured to define an opening therein extending from a top surface of the source/drain region, wherein a first width of the opening from a portion above the top surface of each of the gate spacers up to a top surface of the interlevel dielectric layer is greater than a second width of the opening from the portion above the top surface of each of the gate spacers to the top surface of the source/drain region, the first width being indented inwards in the interlevel dielectric layer relative to the second width; and a liner layer disposed on sidewalls of the interlevel dielectric layer in the portion of the opening having the first width from the portion above the top surface of each of the gate spacers to the top surface of the source/drain region; wherein a top surface of outer ends of the liner layer is below the top surface of the interlevel dielectric layer.

15. The integrated circuit of claim 14, further comprising:

a silicide layer disposed on the top surface of the source/drain region and on a portion of the interlevel dielectric layer.

16. The integrated circuit of claim 15, wherein the liner layer is disposed on a portion of the silicide layer.

17. The integrated circuit of claim 16, further comprising:

a conductive material disposed on the silicide layer and the liner layer and filling the opening.

18. The integrated circuit of claim 17, further comprising a metallization layer disposed on a top surface of the at least one of the semiconductor structures and configured to connect with the conductive material.

19. The integrated circuit of claim 15, wherein the silicide layer is a metal silicide layer, and the liner layer comprises a nitride.

20. The integrated circuit of claim 14, wherein the gate structures comprise a high-K dielectric material.

* * * * *